United States Patent [19]
Perkins et al.

[11] 3,784,725
[45] Jan. 8, 1974

[54] ELECTRONIC HYBRID PACKAGE

[75] Inventors: Carroll R. Perkins, San Diego; Irwin A. Lucks, Garden Grove, both of Calif.

[73] Assignee: Solitron Devices, Inc., San Diego, Calif.

[22] Filed: July 24, 1972

[21] Appl. No.: 274,627

[52] U.S. Cl. .............................. 174/52 R, 58/23 R
[51] Int. Cl. ........................ H02g 13/08, H05k 5/00
[58] Field of Search ............................. 29/627, 626; 174/52 R, 52 S; 58/23 BA, 23 R, 88 R, 88 W; 317/101 R, 101 B, 101 C, 101 CC; 179/107 R; 206/45.34

[56] References Cited

UNITED STATES PATENTS

| | | | |
|---|---|---|---|
| 3,129,557 | 4/1964 | Fiechter | 58/23 R |
| 3,505,804 | 4/1970 | Hofstein | 58/50 R |
| 3,509,715 | 5/1970 | DeKoster | 58/23 R |
| 3,672,155 | 6/1972 | Bergey et al. | 58/50 R |
| 2,640,099 | 5/1953 | Hull | 179/107 R X |
| 3,029,367 | 4/1962 | Tomonoh et al. | 317/101 C |
| 3,105,876 | 10/1963 | Mullin et al. | 179/107 R X |
| 3,191,097 | 6/1965 | Dano et al. | 174/52 R X |
| 3,320,486 | 5/1967 | Riseman et al. | 317/101 C |
| 3,681,665 | 8/1972 | Olds et al. | 317/101 CC |
| 3,693,089 | 9/1972 | Hutchinson et al. | 174/52 R |

*Primary Examiner*—Stephen J. Tomsky
*Assistant Examiner*—U. Weldon
*Attorney*—Richard G. Geib

[57] ABSTRACT

An electronic package in which semiconductor technology is bonded to a lead-frame and thereafter encapsulated and formed to be functional of its self.

5 Claims, 3 Drawing Figures

ELECTRONIC HYBRID PACKAGE

BACKGROUND OF INVENTION

Prior art electronic systems have all utilized several packages connected together in several stages of assembly requiring a number of connections.

It has been stated that in any device the reliability is enhanced by the elimination of the need for connections.

For example, and in regard to the emerging utilization of electronics in time pieces, the trend has been to build-up the several circuits separately and use connectors between them and the time display in order to complete the package which is inserted within a casing. Each connection creates problems of reliability as well as increases the cost of manufacture by the very nature of the complex assembly process required.

The purpose of this invention is to overcome the aforesaid problems with a self contained electronic package for use with time display means and other devices requiring a trouble-free compact assembly.

A more particular object of this invention is to provide a module containing the electronic devices, the power sources, the adjusting means and their interconnections plus output terminals in a package which seals same from air and moisture.

A further detailed object of this invention is to manufacture an electronic package by means of orienting a lead frame to receive electrical components, bonding the components to the lead frame, molding a body around the lead frame to form a housing for the electrical components, trimming the molded body to a preselected form and mating a display means thereto to seal and cover the housing whereby said components are sealed from air and moisture.

DETAILED DESCRIPTION

Figure 1:
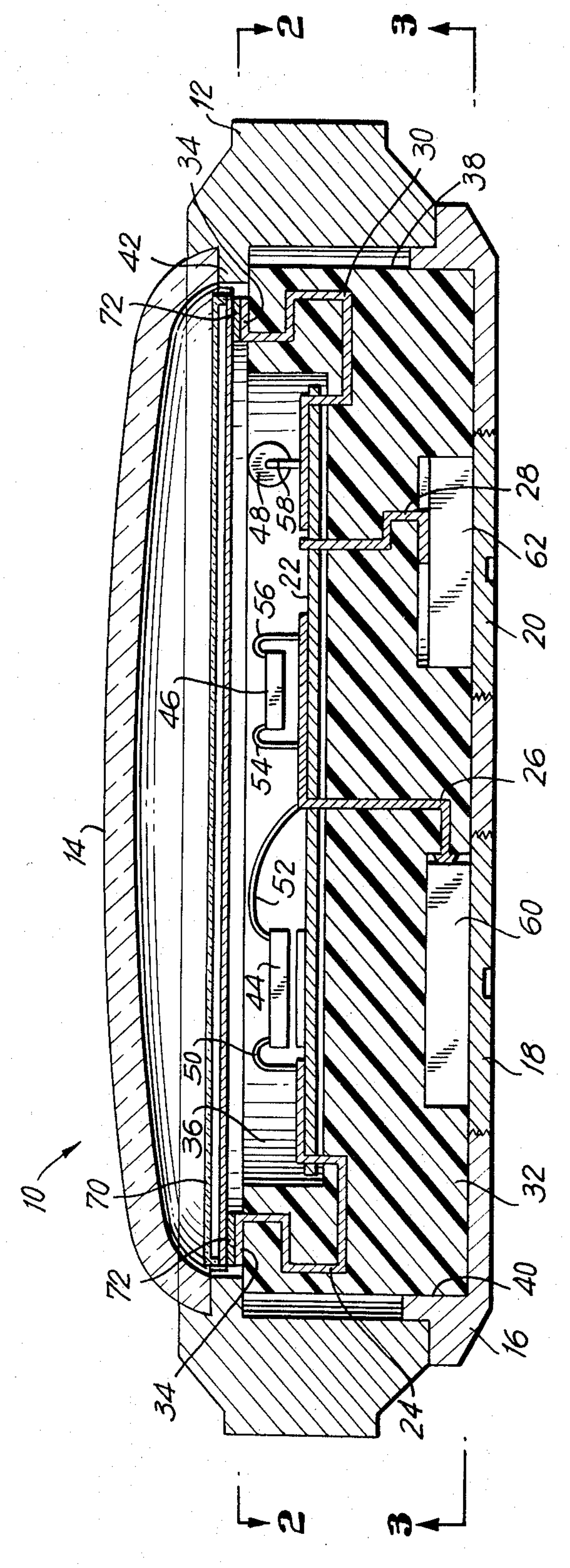
FIG. 1 is a cross-sectional side view of an electronic package according to this invention as utilized in a watch housing.
Figure 2:
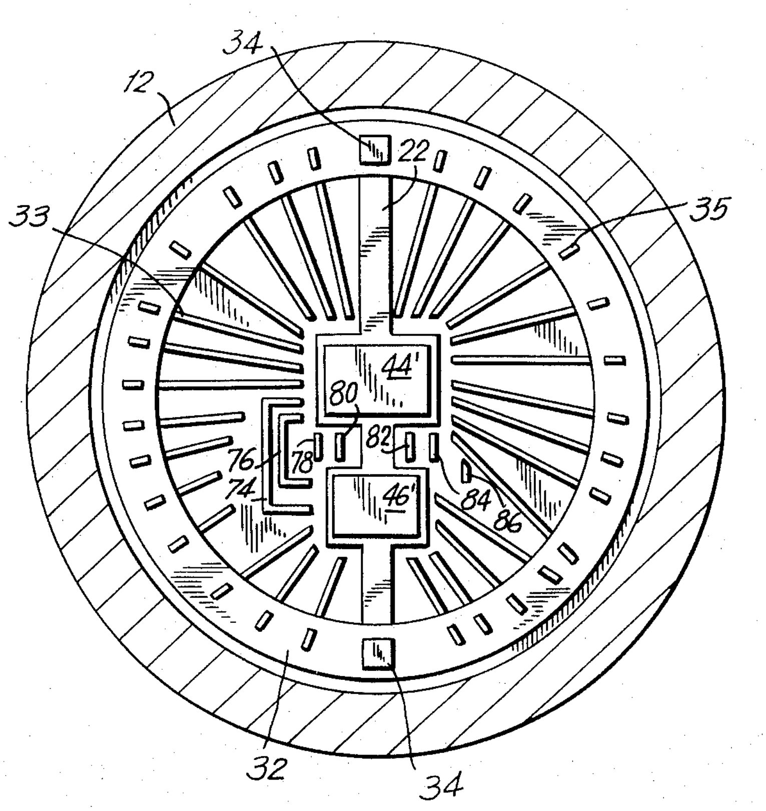
FIG. 2 is a cross-sectional top plan view of the electronic package of FIG. 1 along lines 2—2 thereof.

With particular reference to FIG. 1 there is shown a watch 10 having a housing 12 a transparent face plate 14 and a bottom 16 with removable portions 18 and 20 within and contained by the housing is an electronic package pursuant to the invention, comprised of: a lead frame 22 having interconnects 24, 26, 28 and 30, whose form and number in regard to its use as an electronic watch package is best seen by FIG. 2, as will be described hereinafter; a substrate material 32 which is molded about the lead frame and interconnects 24, 26, 28 and 30, as shown by FIG. 1, and trimmed to provide top contacts 33, a cavity 36 bounded by a peripheral wall 38 shaped to be held by rim 40 of bottom 16 and ring 42 of housing 12; and, electrical devices such as semiconductors 44 and 46 and another electrical component 48 whose leads 50, 52, 54, 56 and 58 are bonded to the lead frame and to the interconnects thereof. The substrate is also formed about interconnects 26 and 28, as shown by FIG. 1, to have cavities adjacent terminal regions therefore for the receipt of battery(s) 60, a crystal 62 and other components as may be necessary to the operation of the package providing for power and adjustment thereof. In regard to a watch these cavities 64, 66 and 68 (see FIG: 3) are located to be accessible through removable portions, such as 18 and 20, for example, for routine servicing.

The package is completed by bonding to the substrate 32 a display to be operable thereby by the electronics within the cavities, for example a liquid crystal 70 having contacts 72 aligned with 34 and 35 with the substrate 32 on one side and the display 70 on the other, as seen in FIG. 1, to close the cavity 36 from air and moisture and cover the electronics therein.

Referring now more specifically to FIG. 2 there is shown the myriad interconnection possibilities which may be accomplished by this invention, whereby conducting paths can be arranged so that electronic component and circuits become an integral part of the total package. Specifically, in regard to the electronic watch package, visualized as one use of this invention, there is proposed a plurality of interconnects 33 in addition to those shown by FIG. 1 leading to a plurality of top contacts 35. Also the areas 44′ and 46′ are provided on the lead frame for bonding of components to the lead frame and to each other by means of interconnects 74, 76, 78, 80, 82, 84 and 86, as may be desired for the predetermined function of the package.

Figure 3:
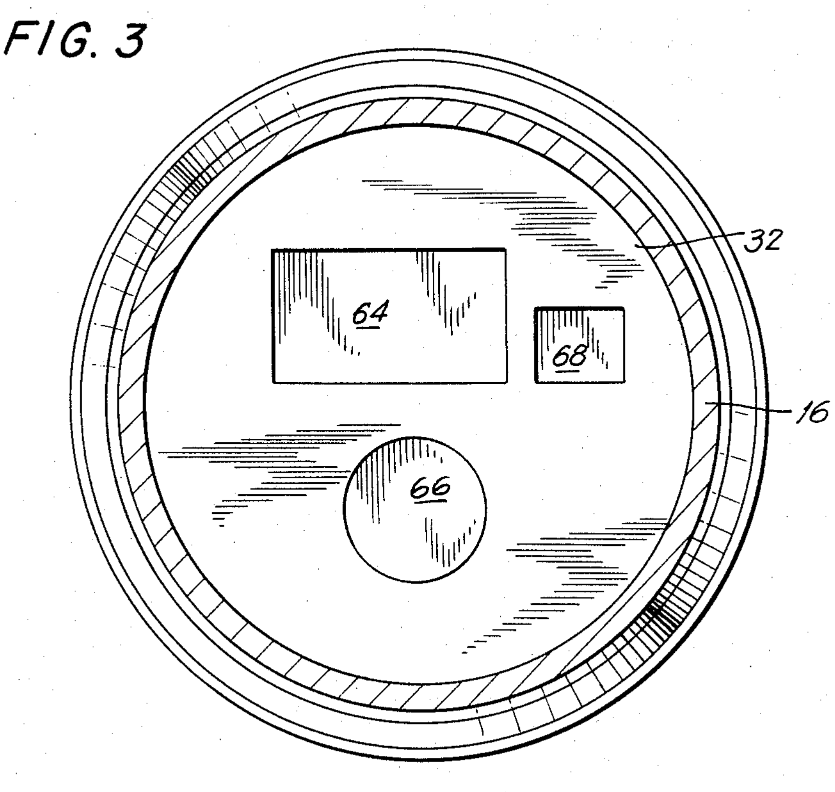
FIG. 3 is a cross-sectional bottom plan view of the electronic package of FIG. 1 along lines 3—3 thereof.

In FIG. 3 we see that the substrate 32 has been formed with three cavities, e.g. for mounting of a battery 66 a crystal oscillator 64 and a trimmer capacitor 68.

As for the method of construction, a lead frame is stamped or etched out of stock material. It is then plated, if desired, to get an inert, electrically conductive surface. Next, with special reference to the use to which this invention has been put in time pieces, semiconductor chips and other electrical components are bonded to the lead frame as by soldering, welding, press fitting, crimping, gluing, beam-lead, flip-chip, etc. After this assembly is complete the unit comprised of the lead frame and attached components is tested. Thereafter an epoxy is placed about the lead frame by machinning or preferably by molding at a temperature below 300°C. The epoxy or analogous material is chosen from a group free of contaminants. Thereafter, the molded epoxy is trimmed to the proper shape and to expose the contacts from the interconnects of the lead frame with the epoxy as desired and the display means is bonded thereto to provide a sealed electronic package which is in itself ready for operation.

It will thus be seen that the objects set forth above, among those made apparent from the preceding description, are efficiently attained, and since certain changes may be made in the above constructions without departing from the scope of the invention, it is intended that all matter contained in the above description or shown on the a accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Having described our invention, what we claim as new and desire to secure by Letters Patent is:

1. An electronic package comprising:

a preformed lead frame means having interconnects leading therfrom;

electronic means connected to said lead frame, a body surrounding the interconnects of said lead frame means, said body being molded about said interconnects to form a peripheral wall about said frame and thereby support said lead frame with said electronic means within an area formed by said wall, said molded body having atleast one cavity spaced from and under said area for said lead frame, said wall and said cavity having exposed contacts of said interconnects on a surface of said wall and a surface within said cavity;

a power supply means receivable within said cavity, said power supply means being connectable to said exposed contacts of said interconnects from said lead frame such that it may be easily installed and replaced from time to time, said power supply means providing power through said lead frame to said electronic means; and controllable means bonded to said peripheral wall of said molded body, said controllable means having circuit connections to said contacts on said peripheral wall whereby said controllable means is operable by said electronic means within the area defined by said wall to thereby with said wall and body provide a sealed housing for said electronic means.

2. The structure of claim 1 wherein said molded body has at least two cavities formed at various locations spaced from and under said lead frame to permit installation of an oscillator means as well as said power supply means within the bounds of the peripheral wall of said molded body for control of said electronic means in that said oscillator means in connectable to said lead frame in the cavity therefor by said interconnects.

3. The structure of claim 2 wherein said controllable means is a display means.

4. The structure of claim 3 and further comprising a metal housing surrounding said package permitting visual observation of said display means on one side thereof, said housing having removable portions on the other side thereof permitting access to said power supply means and said oscillator means in the cavities containing same, said housing being otherwise is sealing contact with said molded body to provide a chamber for said display means above said molded body sealed from atmospheric conditions.

5. The structure of claim 4 wherein said metal housing has a transparent portion over said chamer for viewing said display means.

* * * * *